(12) United States Patent
Kim

(10) Patent No.: US 6,937,173 B2
(45) Date of Patent: Aug. 30, 2005

(54) SERIALIZER AND METHOD OF SERIALIZING PARALLEL DATA INTO SERIAL DATA STREAM

(75) Inventor: Chi-Won Kim, Chungju-si (KR)

(73) Assignee: Samsung Electronics Co, LTD, Gyeonggi-do (KR)

( * ) Notice: Subject to any disclaimer, the term of this patent is extended or adjusted under 35 U.S.C. 154(b) by 0 days.

(21) Appl. No.: 10/770,491

(22) Filed: Feb. 4, 2004

(65) Prior Publication Data

US 2005/0024243 A1 Feb. 3, 2005

(30) Foreign Application Priority Data

Jul. 29, 2003 (KR) .............................. 10-2003-0052380

(51) Int. Cl.[7] .............................................. H03M 9/00
(52) U.S. Cl. ...................................................... 341/101
(58) Field of Search ................................ 341/100, 101, 341/144; 327/407; 375/257; 326/96

(56) References Cited

U.S. PATENT DOCUMENTS

| | | | |
|---|---|---|---|
| 5,055,842 A | * | 10/1991 | Mueller ...................... 341/100 |
| 6,121,906 A | * | 9/2000 | Kim ............................ 341/100 |
| 6,437,725 B1 | * | 8/2002 | Kwak et al. ................. 341/159 |
| 6,567,423 B1 | * | 5/2003 | Iyer ............................ 370/505 |
| 6,741,193 B2 | * | 5/2004 | Nagata ........................ 341/101 |
| 6,771,194 B2 | * | 8/2004 | Shi ............................. 341/101 |

* cited by examiner

Primary Examiner—Brian Young
(74) Attorney, Agent, or Firm—Harness, Dickey & Pierce, P.L.C.

(57) ABSTRACT

A serializer serializes N data (N>2) in N stages into a serial data stream. Each stage includes a logic section and a first inverter. The logic section receives i-th data (where i is less than or equal to N) of the N parallel data to output the i-th data or inverted i-th data in response to an active status or an inactive status of an j-th clock signal (where j is less than or equal to N) of the N clock signals. The first inverter receives the i-th data or the inverted i-th data from the logic section and inverts the i-th data or the inverted i-th data to output a first output signal. The output signal of the serializer may have reduced jitter even when the serializer operates in a high speed and a low power condition.

29 Claims, 17 Drawing Sheets

SERIALIZER AND METHOD OF SERIALIZING PARALLEL DATA INTO SERIAL DATA STREAM

CROSS-REFERENCE TO RELATED APPLICATIONS

This application relies for priority upon Korean Patent Application No. 2003-52380 filed on Jul. 29, 2003, the contents of which are herein incorporated by reference in its entirety.

BACKGROUND OF THE INVENTION

1. Field of the Invention

The present invention relates to a serializer and a method of serializing parallel data into a serial data stream, and more particularly to a serializer and a method of serializing parallel data into a serial data stream, which reduces or prevents the jitter of a serialized output signal in high speed and/or low voltage applications.

2. Description of the Related Art

FIG. 1 is a circuit diagram showing a conventional 2:1 serializer 100. The conventional 2:1 serializer 100 includes a first pull-up section 10, a second pull-up section 14, a first pull-down section 12 and a second pull-down section 16. The first pull-up section 10 includes two PMOS transistors P1 and P2, the second pull-up section 14 includes two PMOS transistors P3 and P4, the first pull-down section 12 includes two NMOS transistors N1 and N2, and the second pull-down section 16 includes two NMOS transistors N3 and N4.

The conventional 2:1 serializer 100 receives a first power voltage VDD, a second power voltage VSS, two parallel data signals D0 and D1 and clock signals CK0 and Ck1, and serializes the parallel data signals D0 and D1 and outputs a serialized data stream via an output terminal OUTB. The first power voltage VDD is a positive voltage level. The second power voltage VSS may have an earth potential or a negative voltage level.

As shown in FIG. 1, when clock signal CK0 has a high level and clock signal CK1 has a low level, PMOS transistor P4 and NMOS transistor N1 are turned on and PMOS transistor P2 and NMOS transistor N3 are turned off. Thus, the second power voltage VSS is outputted to the output terminal OUTB when the data D1 has a high level.

When clock signal CK0 has a low level and clock signal CK1 has a high level, PMOS transistor P2 and NMOS transistor N3 are turned on and PMOS transistor P4 and NMOS transistor N1 are turned off. Thus, the first power voltage VDD is outputted to the output terminal OUTB when the data D0 has a high level and the serialized output signal swings between the first and second power voltage VDD and VSS.

According to the conventional serializer 100, gate-source parasitic capacitance Cgs, a gate-drain parasitic capacitance Cgd and a source-substrate parasitic capacitance Csb may exist at the node Da, Db, Dc and Dd. Thus, a coupling effect is induced. As a result, jitter is generated due to inter symbol interference (ISI) between the input signals (CK0, CK1, D0, D1) and the output signal. Jitter is likely to be generated due to inter symbol interference (ISI) because of the full swing of the output signal between the first and second power voltages, VDD and VSS.

In another conventional serializer, the serializer is connected to a large output driver transistor and the serializer requires an additional bias circuit for maintaining a voltage level of a voltage signal inputted to the output driver transistor to a special voltage level to reduce or prevent fluctuations in the voltage level of the voltage signal. Thus, the serializer requires an increased semiconductor chip area due to the additional circuitry.

In yet another conventional serializer, when data and clock signals are input to the serializer, the voltage output at floating nodes of serially connected NMOS transistors affects an output signal of the serializer, and jitter may again be induced. In addition, a load of PMOS transistor is turned on always even during power down status and the serializer consumes a lot of power.

SUMMARY OF THE INVENTION

Exemplary embodiments of the present invention provide a serializer that removes the coupling effect thereof and reduces the jitter due to inter symbol interference (ISI).

Exemplary embodiments of the present invention provide a method of serializing a plurality of parallel data, which removes the coupling effect thereof and reduces the jitter due to inter symbol interference (ISI).

An exemplary embodiment of the present invention is directed to a serializer for transforming N parallel data (where N is a natural number greater than 2) into a serial data stream using N clock signals each having different phase to output the serial data stream. The serializer may have N stages, coupled in parallel, Each stage may include a logic section and a first inverter. The logic section receives i-th data (where i is a natural number less than or equal to N) of the N parallel data to output the i-th data or inverted i-th data in response to an active status or an inactive status of a j-th clock signal (where j is a natural number less than or equal to N) of the N clock signals. The first inverter receives the i-th data or the inverted i-th data from the logic section and inverts the i-th data or the inverted i-th data to output a first output signal via an output terminal.

In an exemplary embodiment, the logic section may include an AND gate for receiving the i-th data and the j-th clock signal to perform a logical AND operation. The first inverter may include i) a first PMOS transistor, a control electrode of the first PMOS transistor receiving an output signal of the logic section of a first stage, and a first current electrode of the first PMOS transistor receiving a first power voltage, ii) a first NMOS transistor, a second current electrode of the first NMOS transistor being coupled to a second current electrode of the first PMOS transistor, a control electrode of the first NMOS transistor being coupled to the control electrode of the first PMOS transistor, and a first current electrode of the first NMOS transistor receiving a second power voltage, iii) a second PMOS transistor, a control electrode of the second PMOS transistor receiving an output signal of the logic section of a second stage, and a first current electrode of the second PMOS transistor receiving the first power voltage, iv) a second NMOS transistor, a second current electrode of the second NMOS transistor being coupled to a second current electrode of the second PMOS transistor, a control electrode of the second NMOS transistor being coupled to the control electrode of the second PMOS transistor, and a first current electrode of the second NMOS transistor receiving the second power voltage.

In an exemplary embodiment, the first output signal may swing between substantially a first level of the first power voltage and a second level. The second level may be determined by a ratio of a size of the second PMOS transistor to a size of the first NMOS transistor so that the first output signals are prevented from swinging between the first level of the first power voltage and a third level of the second power voltage. In an exemplary embodiment, the ratio of the size of the second PMOS transistor to the size of the first NMOS transistor is about 1:1.

Another exemplary embodiment of the present invention is directed to a serializer for transforming first and second data into a serial data stream using first and second clock signals each having a different phase to output the serial data stream. The serializer may include a first logic section, a first inverter, a second logic section and a second inverter. The first logic section receives the first data to output the first data or an inverted first data in response to an active status or an inactive status of the first clock signal. The first inverter inverts the first data or the inverted first data to output a first output signal via an output terminal. The second logic section receives the second data to output the second data or an inverted second data in response to an active status or an inactive status of the second clock signal. The second inverter inverts the second data or the inverted second data to output a second output signal via the output terminal.

Another exemplary embodiment of the present invention is directed to a method of serializing N parallel data into a serial data stream. The i-th data of the N parallel data is received, and the i-th data or inverted i-th data is output in response to an active status or an inactive status of an j-th clock signal of N clock signals having different phase each other. As set forth above, N is a natural number higher than 2, and i and j are natural numbers less than or equal to N. The i-th data or the inverted i-th data is inverted and an output signal is outputted as the serial data stream.

Another exemplary embodiment of the present invention is directed to a method of serializing first and second data into a serial data stream using first and second clock signals each having different phase. The first data is received, and the first data or an inverted first data is outputted in response to an active status or an inactive status of the first clock signal. The first data or the inverted first data are inverted to be outputted as a first output signal. The second data is received, and the second data or an inverted second data is output in response to an active status or an inactive status of the second clock signal. The second data or the inverted second data are inverted to be outputted as a second output signal.

Another exemplary embodiment of the present invention is directed to a stage of a serializer including a logic section for receiving a portion of parallel data and outputting the portion of data or the inverted portion of data in response to an active status or an inactive status of a corresponding clock signal of a plurality of clock signals and an inverter for receiving the portion of data or the inverted portion of data from the logic section and for inverting the portion of data or the inverted portion of data to output a first output signal.

Another exemplary embodiment of the present invention is directed to a serializer including N stages (where N is a natural number greater than 2) for transforming N parallel data into a serial data stream using N clock signals each having a different phase to output the serial data stream, wherein each of the N stages is coupled in parallel.

Another exemplary embodiment of the present invention is directed to a serializer for transforming N (where N is a natural number greater than 2) parallel data into a serial data stream using N clock signals each having different phase to output the serial data stream, the serializer having N stages, each of the stages coupled in parallel, each of the stages including means for receiving parallel data and a clock signal and means for generating serial data from the parallel data to produce a serial output signal, such that the first output signal swings substantially between a first power voltage and a second voltage, wherein the second voltage is determined by a ratio of a size of two or more transistors of the means for generating so that the first output signal does not swing between the first power voltage and a second power voltage.

Another exemplary embodiment of the present invention is directed to a serializer including one or more of a single type serial data generator, a differential type serial data generator, an AND/NAND-gate implemented serial data generator, and/or an OR/NOR-gate implemented serial data generator.

In an exemplary embodiment of the present invention, N is 2.

Exemplary embodiment of the serializer of the present invention may be applied to a high speed serializer or serializer-deserializer having a transfer rate of 1–2 Gbps (gigabits per second). In an exemplary embodiment, the serializer may be applied to serializers used in Ethernets, a base station of a mobile communication system, an exchange of ATM (Asynchronous Transfer Mode) or a hard disc of a computer.

According to exemplary embodiment of the present invention, a coupling effect and/or an ISI between input signals and output signals of the serializer may be reduced, and thus the output signal of the serializer has less jitter even when the serializer operates in a high speed and a low power condition.

In an exemplary embodiment, the coupling effect of a 2:1 serializer or a 5:1 serializer of a 10:1 serializer is effectively reduced, and thus data dependent jitter (DDJ) may be reduced since the 2:1 serializer or the 5:1 serializer of the 10:1 serializer affects the jitter characteristic of the output signal of the 10:1 serializer.

BRIEF DESCRIPTION OF THE DRAWINGS

The present invention will become more apparent by describing in detail exemplary embodiments thereof with reference to the accompanying drawings, in which.

DESCRIPTION OF EXEMPLARY EMBODIMENTS

Detailed, illustrative, exemplary embodiments of the present invention are disclosed herein. However, specific structural and functional details disclosed herein are merely representative for purposes of describing exemplary embodiments of the present invention.

Figure 2:
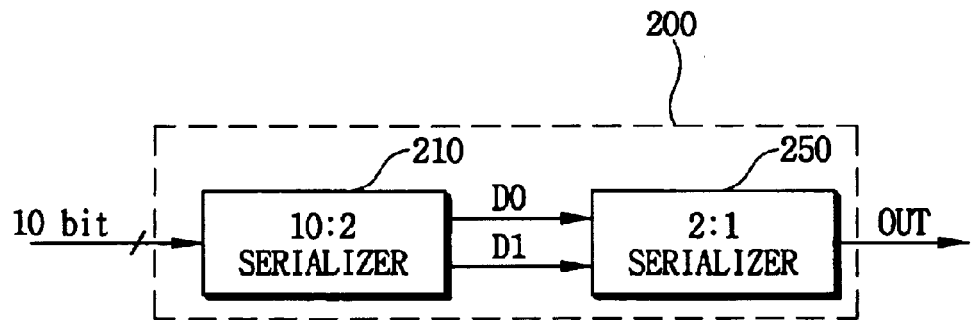
FIG. 2 is a block diagram showing a 10:1 serializer having a 2:1 serializer according to an exemplary embodiment of the present invention.

FIG. 2 is a block diagram showing a 10:1 serializer having a 2:1 serializer according to an exemplary embodiment of the present invention. The 10:1 serializer 200 may be implemented as a 10:2 serializer 210 and a 2:1 serializer 250 or a 10:5 serializer and a 5:1 serializer depending on a clock speed.

Referring to FIG. 2, the 10:1 serializer 200 includes the 10:2 serializer 210 and the 2:1 serializer 250. The 10:2 serializer 210 receives 10 bits of data in parallel and outputs two data signals D0 and D1. The 2:1 serializer 250 receives the two data signals D0 and D1 and serializes the two data signals D0 and D1 to output a serialized data stream via an output terminal OUT.

Figure 3:
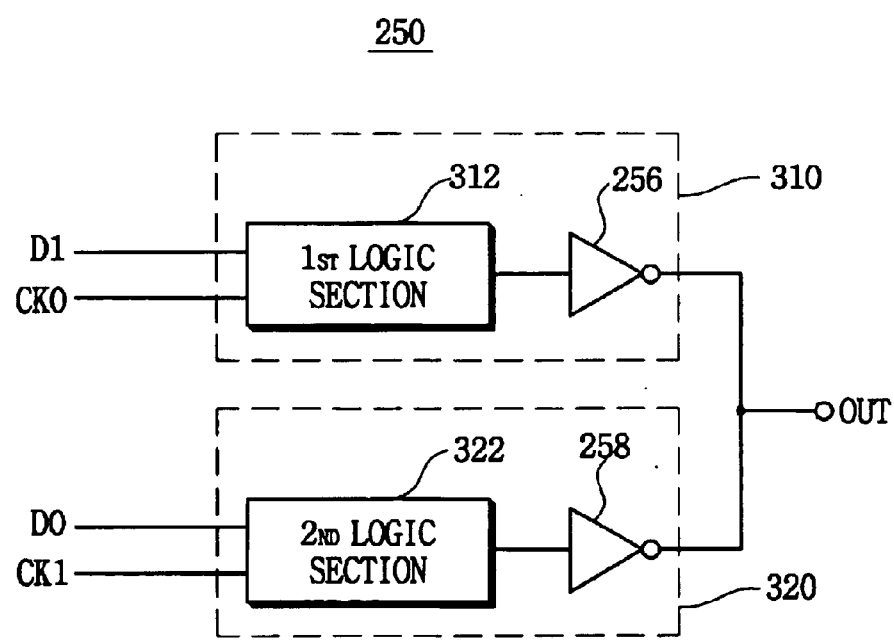
FIG. 3 is a block diagram showing the 2:1 serializer of FIG. 2 according to an exemplary embodiment of the present invention.

FIG. 3 is a block diagram showing the 2:1 serializer of FIG. 2 according to an exemplary embodiment of the present invention. Referring to FIG. 3, the 2:1 serializer 250 includes a first stage 310 and a second stage 320. The second stage 320 is coupled to the first stage 310 in parallel.

The first stage 310 includes a first logic section 312 and a first inverter 256, and the second stage 320 includes a second logic section 322 and a second inverter 258.

The first logic section 312 receives D1 of the two data signals D0 and D1 and outputs D1 or an inverted D1 ($\overline{D1}$) in response to an active status or an inactive status of the clock signal CK0. The first inverter 256 inverts D1 or $\overline{D1}$ output from the first logic section 312 to output a first output signal via the output terminal OUT.

Figure 4:
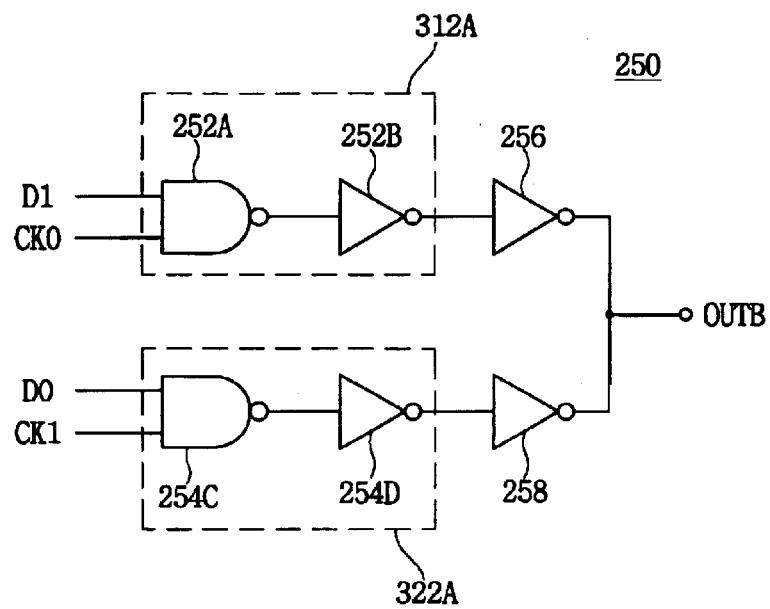
FIG. 4 is an equivalent logic circuit diagram showing a 2:1 serializer according to an exemplary embodiment of the present invention.

The second logic section 322 receives D0 of the two data signals D0 and D1 to output D0 or an inverted D0 ($\overline{D0}$) in response to the active status or the inactive status of the clock signal CK1. The second inverter 258 inverts D0 or $\overline{D0}$ output from the second logic section 322 to output a second output signal via the output terminal OUT FIG. 4 is an equivalent logic circuit diagram showing a 2:1 serializer according to an exemplary embodiment of the present invention. Referring to FIG. 4, the 2:1 serializer 250 includes a first logic section 312a and a first inverter 256, a second logic section 322a and a second inverter 258.

The first logic section 312a includes a first NAND gate 252a and an inverter 252b, and the second logic section 322a includes a second NAND gate 254c and an inverter 254d.

The first NAND gate 252a receives the data D1 and clock signal CK0 and performs a logical NAND operation on the data D1 and clock signal CK0. The inverter 252b inverts the output signal of the first NAND gate 252a, and the first inverter 256 inverts the output signal of the inverter 252b to output the inverted output signal via the output terminal OUT.

The second NAND gate 254c receives the data D0 and clock signal CK1 and performs a logical NAND operation on the data D0 and clock signal CK1. The inverter 254d inverts the output signal of the second NAND gate 254c, and the second inverter 258 inverts the output signal of the inverter 254d to output the inverted output signal via the output terminal OUT.

Figure 5:
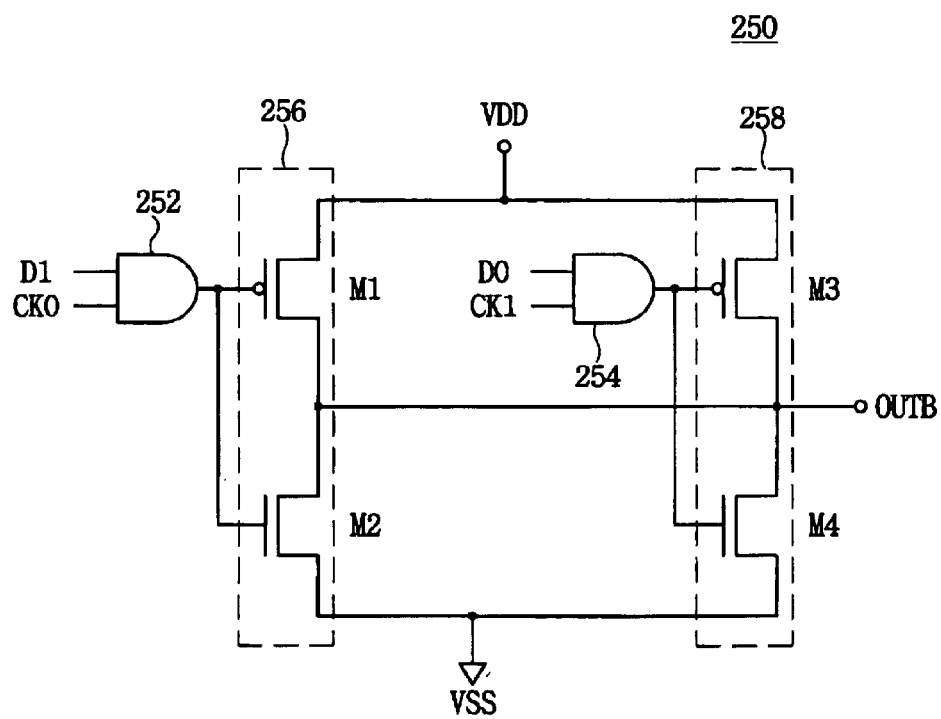
FIG. 5 is a circuit diagram showing the 2:1 serializer of FIG. 4 according to another exemplary embodiment of the present invention.
Figure 6:
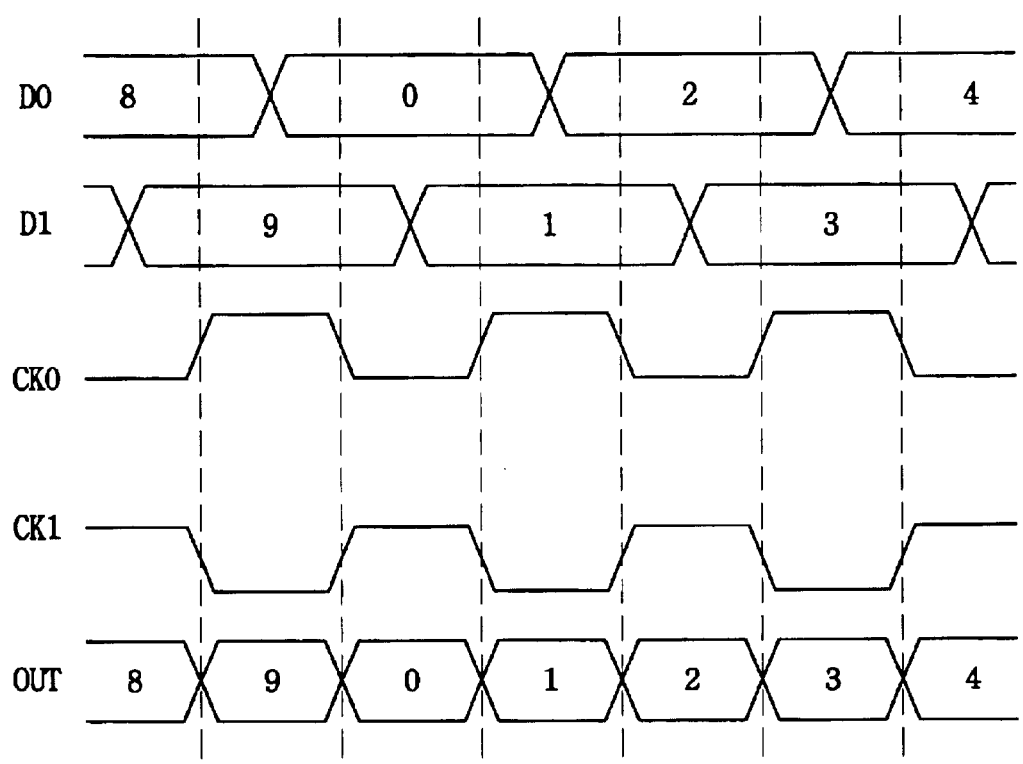
FIG. 6 is a timing diagram showing input data and serialized output data stream of the 2:1 serializer of FIG. 5 according to an exemplary embodiment of the present invention.

FIG. 5 is a circuit diagram showing the 2:1 serializer of FIG. 4, and FIG. 6 is a timing diagram showing input data and serialized output data stream of the 2:1 serializer of FIG. 5 according to an exemplary embodiment of the present invention.

Referring to FIG. 5, the 2:1 serializer 250 receives the data signals D0 and D1, and serializes the data signals D0 and D1 in response to the active status or the inactive status of clock signals CK0 and CK1 into a serialized data stream to output the serialized data stream via the output terminal OUT. In an exemplary embodiment of the present invention, the clock signal CK0 has an inverted phase with respect to the clock signal Ck1.

The first AND gate 252 corresponds to the first NAND gate 252a and the inverter 252b of FIG. 4. The first AND gate 252 receives data D1 and clock signal CK0, and the output of the first AND gate 252 is commonly coupled to a gate electrode of a first transistor M1 and a gate electrode of a second transistor M2 of the first inverter 256. In an exemplary embodiment of the present invention, the first transistor M1 is a PMOS transistor, and the second transistor M2 is an NMOS transistor. In an exemplary embodiment of the present invention, the first inverter 256 includes the first and second transistors M1 and M2.

The second AND gate 254 corresponds to the second NAND gate 254a and the inverter 254b of FIG. 4. The second AND gate 254 receives the data D0 and clock signal CK1, and the output of the second AND gate 254 is commonly coupled to a gate electrode of a third transistor M3 and a gate electrode of a fourth transistor M4 of the second inverter 258. In an exemplary embodiment of the present invention, the third transistor M3 is a PMOS transistor, and the fourth transistor M4 is an NMOS transistor. In an exemplary embodiment of the present invention, the second inverter 258 includes the third and fourth transistors M3 and M4.

Hereinafter, the operation of the serializer 250 of FIG. 5 is described with reference to FIGS. 5 and 6. In an exemplary embodiment of the present invention, an active level of a signal may represent a high (or low) level of the signal, and an inactive level of the signal may represent a low (or high) level of the signal.

When the clock signal CK0 has an active level and the clock signal CK1 has an inactive level, the first AND gate 252 outputs D1, the second AND gate 254 has an inactive level, the third transistor M3 is turned on, and the fourth transistor M4 is turned off. In the above case, when the data D1 has an active level, since the first transistor M1 is turned off and the second transistor M2 is turned on, a current path is formed between the second and third transistors M2 and M3. Thus, the first output signal of the output terminal OUTB has a voltage level determined by a ratio of a size of the second transistor M2 to a size of the third transistor M3. When the data D1 has an inactive level, the first output signal of the output terminal OUTB has substantially the first power voltage VDD. Therefore, the first output signal swings between the first power voltage VDD and the voltage level determined by the ratio of the size of the second transistor M2 to the size of the third transistor M3. As a result, varying the sizes of the second and third transistors M2 and M3 may regulate the swing width of the first output signal.

When the clock signal CK1 has an active level and the clock signal CK0 has an inactive level, the second AND gate 254 outputs the data D0, the first AND gate 252 has an inactive level, the first transistor M1 is turned on, and the second transistor M2 is turned off. In the above case, when the data D0 has an active level, since the second and third transistors M2 and M3 are turned off and the first and fourth transistors M1 and M4 are turned on, a current path is formed between the first and fourth transistors M1 and M4. Thus, the first output signal of the output terminal OUTB has a voltage level determined by a ratio of a size of the first transistor M1 to a size of the fourth transistor M4. When the data D0 has an inactive level, the first output signal of the output terminal OUTB has substantially the first power voltage VDD. Therefore, the first output signal swings between the first power voltage VDD and the voltage level determined by the ratio of the size of the first transistor M1 to the size of the fourth transistor M4. As a result, varying the sizes of the first and fourth transistors M1 and M4 may regulate the swing width of the first output signal.

In an exemplary embodiment, the ratio of the size of the second transistor M2 to the size of the third transistor M3 is about 1:1. In an exemplary embodiment, the ratio of the size of the first transistor M1 to the size of the fourth transistor M4 is about 1:1. A result of implementing these ratios is that a full-swing of the first output signal between the first power voltage VDD and the second power voltage VSS may be prevented, and a half-swing of the first output signal may be induced. A less-than-full swing, such as a half-swing, reduces the jitter due to ISI.

Figure 7:
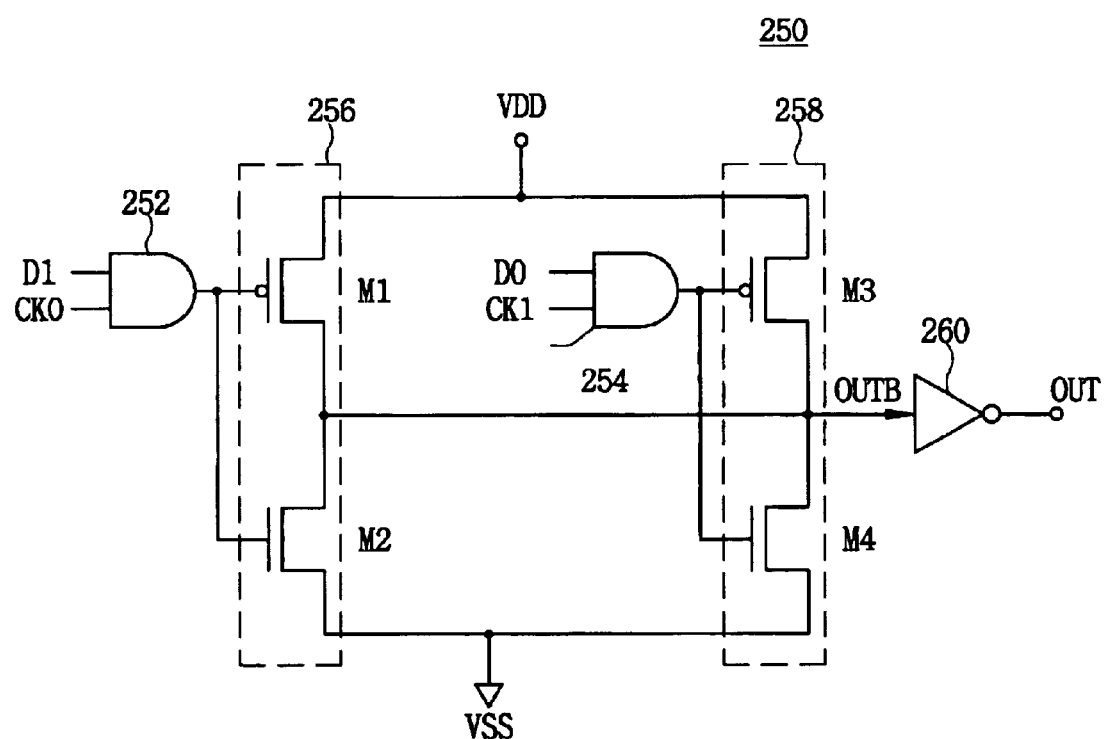
FIG. 7 is a circuit diagram showing a single type 2:1 serializer using the 2:1 serializer of FIG. 5 according to an exemplary embodiment of the present invention.

FIG. 7 is a circuit diagram showing a single type 2:1 serializer using the 2:1 serializer of FIG. 5 in accordance with another exemplary embodiment of the present invention. In the single type 2:1 serializer, the first output signal of the output terminal OUTB of the serializer 250 is inverted by the inverter 260, and is outputted to an output terminal OUT.

Figure 8:
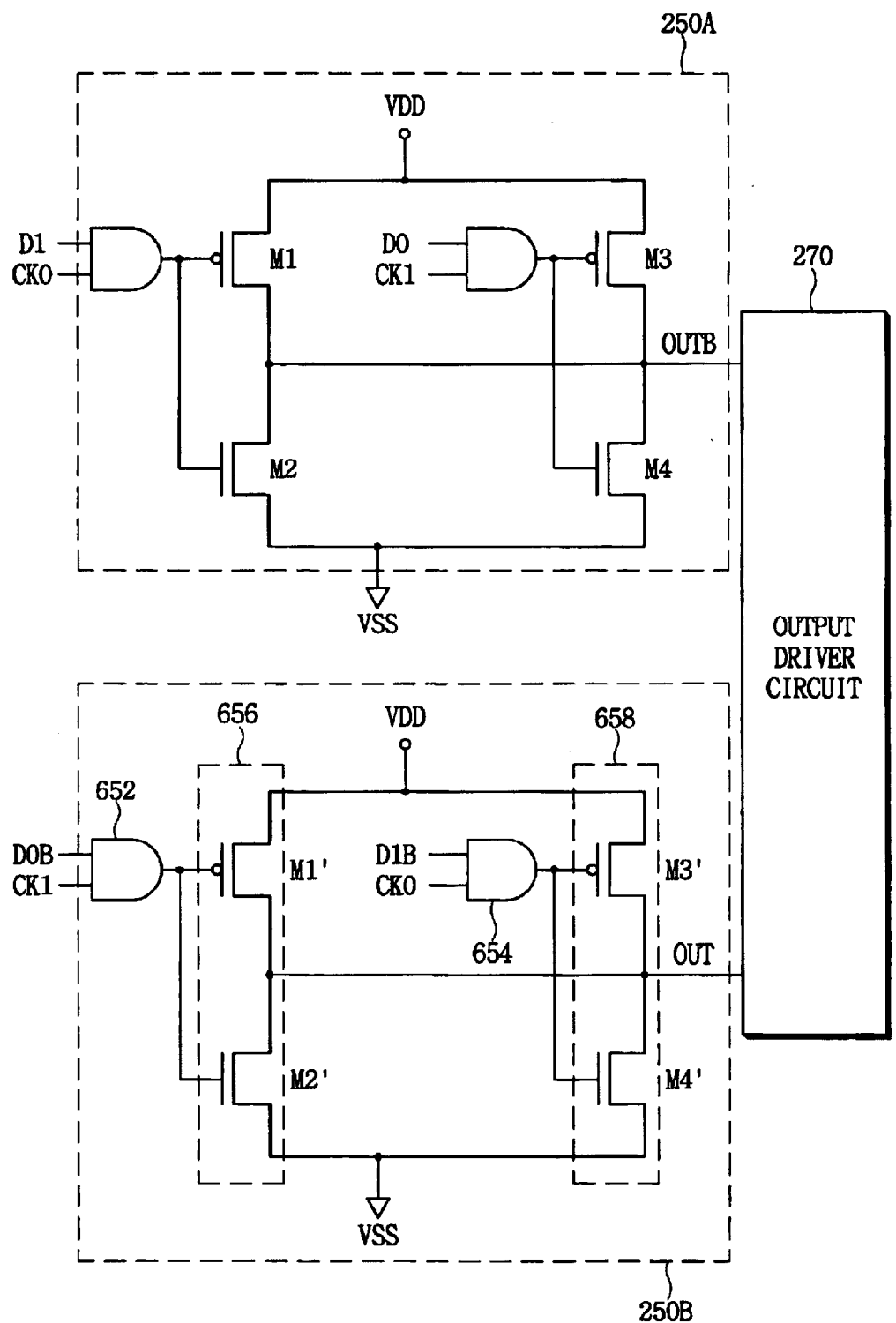
FIG. 8 is a circuit diagram showing a differential type 2:1 serializer using the 2:1 serializer of FIG. 5 according to an exemplary embodiment of the present invention.

FIG. 8 is a circuit diagram showing a differential type 2:1 serializer using the 2:1 serializer of FIG. 5 in accordance with another exemplary embodiment of the present invention.

Referring to FIG. 8, the differential type 2:1 serializer includes a first serializer 250a, a second serializer 250b and an output driver circuit 270. The first serializer 250a may have the same circuit structure as that of the single type 2:1 serializer of FIG. 7.

The second serializer 250b receives data signals D0B and D1B, and serializes the data signals D0B and D1B in response to the active status or the inactive status of clock signals CK0 and CK1 into a serialized data stream to output the serialized data stream via the output terminal OUT. D0B and D1B are referred to as inverted D0 and inverted D1, respectively.

The second serializer 250b includes a third AND gate 652, a fifth AND gate 656, a sixth AND gate 658 and a fourth AND gate 654. The fifth AND gate 656 includes a PMOS transistor M1' and a NMOS transistor M2'. The inverter 658 includes a PMOS transistor M3' and a NMOS transistor M4'

When clock signal CK1 has an active level and clock signal CK0 has an inactive level, the third AND gate 652 outputs the data D0B, the fourth AND gate 654 has an inactive level, the transistor M3' is turned on, and the transistor M4' is turned off. In the above case, when data D0B has an active level, since the transistor M1' is turned off and the transistor M2' is turned on, a current path is formed between the transistors M2' and M3'. Thus, a second output signal of the output terminal OUT has a voltage level determined by a ratio of a size of the transistor M2' to a size of the transistor M3'. When data D0B has an inactive level, the second output signal of the output terminal OUT has substantially the first power voltage VDD. Therefore, the second output signal swings between the first power voltage VDD and the voltage level determined by the ratio of the size of the transistor M2' to the size of the transistor M3'. Varying the sizes of the transistors M2' and M3' may regulate the swing width of the second output signal.

When clock signal CK0 has an active level and clock signal CK1 has an inactive level, the fourth AND gate 654 outputs D1B, the third AND gate 652 has an inactive level, the transistor M1' is turned on, and the transistor M2' is turned off. In the above case, when the data D1B has an active level, since the transistor M3' is turned off and the transistors M1' and M4' are turned on, a current path is formed between the transistors M1' and M4'. Thus, the second output signal of the output terminal OUT has a voltage level determined by a ratio of a size of the transistor M1' to a size of the transistor M4'. When the data D1B has an inactive level, the second output signal of the output terminal OUT has substantially the first power voltage VDD. Therefore, the second output signal swings between the first power voltage VDD and the voltage level determined by the ratio of the size of the transistor M1' to the size of the transistor M4'. As a result, varying the sizes of the transistors M1' and M4' may regulate the swing width of the second output signal.

The first output signal of the output terminal OUTB and the second output signal of the output terminal OUT are provided to the output driver circuit 270.

Figure 9:
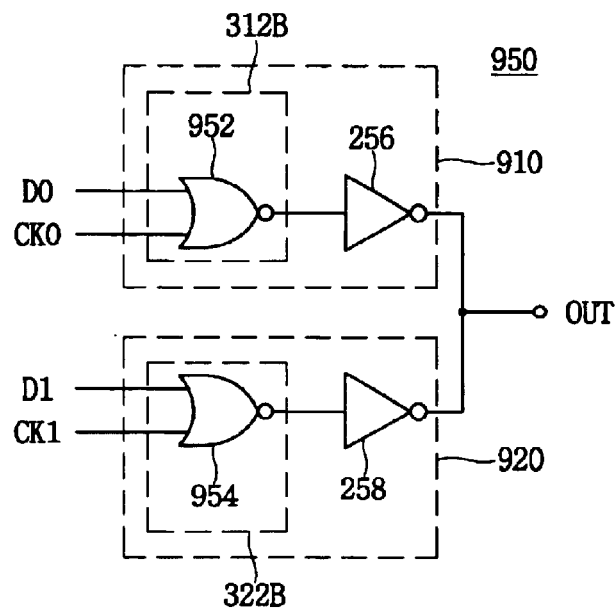
FIG. 9 is an equivalent logic circuit diagram showing a 2:1 serializer according to another exemplary embodiment of the present invention

FIG. 9 is an equivalent logic circuit diagram showing a 2:1 serializer according to another exemplary embodiment of the present invention.

Referring to FIG. 9, the 2:1 serializer 950 includes a first stage 910 further including a first logic section 312b and a first inverter 256 and a second stage 920 further including a second logic section 322b and a second inverter 258. The first logic section 312b includes a first NOR gate 952 and the second logic section 322b includes a second NOR gate 954.

The first NOR gate 952 receives the data D0 and clock signal CK0 and performs a logical NOR operation on the data D0 and clock signal CK0. The first inverter 256 inverts the output signal of the first NOR gate 952 to output the inverted output signal via the output terminal OUT.

The second NOR gate 954 receives the data D1 and clock signal CK1 and performs the logical NOR operation on the data D1 and clock signal CK1. The second inverter 258 inverts the output signal of the second NOR gate 954 to output the inverted output signal via the output terminal OUT.

Hereinafter, the operation of the serializer 950 of FIG. 9 is described.

When the clock signal CK0 has an inactive level, the first NOR gate 952 outputs the inverted D0 (D0B). The first inverter 256 inverts the output signal D0B of the first NOR gate 952 to output data D0 via the output terminal OUT.

When the clock signal CK1 has an inactive level, the second NOR gate 954 outputs the inverted D1 (D1B). The second inverter 258 inverts the output signal D1B of the second NOR gate 954 to output data D1 via the output terminal OUT.

Figure 10:
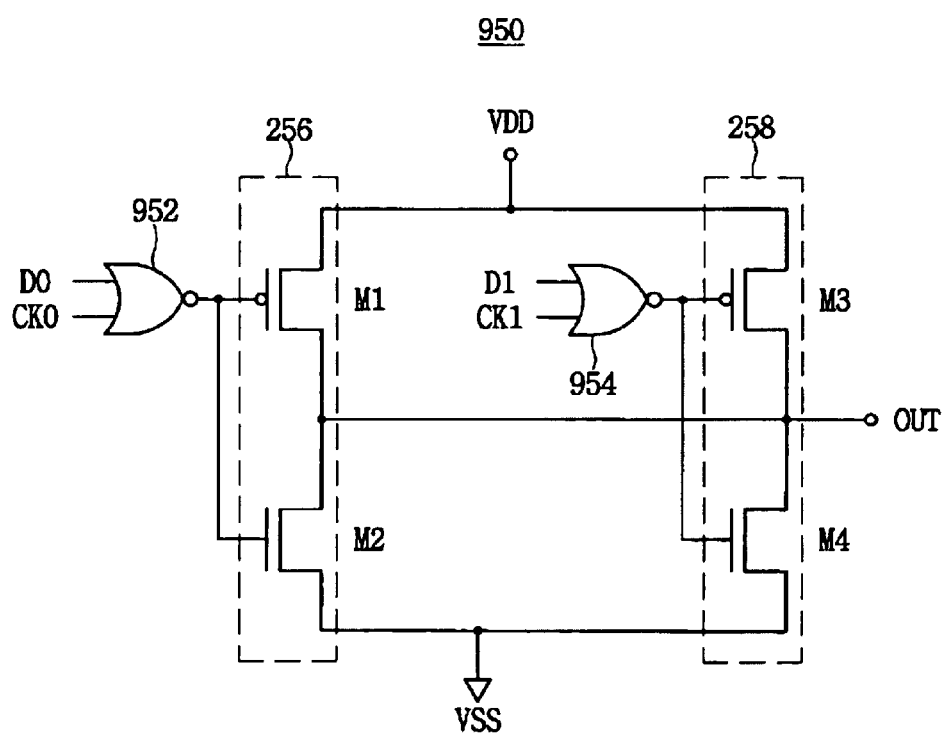
FIG. 10 is a circuit diagram showing the 2:1 serializer of FIG. 9 according to an exemplary embodiment of the present invention.

FIG. 10 is a circuit diagram showing the 2:1 serializer of FIG. 9 in accordance with an exemplary embodiment of the present invention. The 2:1 serializer 950 of another exemplary embodiment has first and second NOR gates 952 and 954 instead of first and second AND gate 252 and 254 compared with the 2:1 serializer of FIG. 5, and the other elements and configuration of the 2:1 serializer of this embodiment are the same as those of the 2:1 serializer of FIG. 5.

When the clock signal CK0 has an inactive level and the clock signal CK1 has an active level, the output signal of the second NOR gate 954 has an inactive level, the third transistor M3 is turned on, and the fourth transistor M4 is turned off. In the above case, when the data D0 has an inactive level, since the first transistor M1 is turned off and the second transistor M2 is turned on, a current path is formed between the second and third transistors M2 and M3. Thus, the output signal of the output terminal OUT has a voltage level determined by a ratio of a size of the second transistor M2 to a size of the third transistor M3. When the data D0 has an active level, since the first transistor M1 is turned on, and the second transistor M2 is turned off, the output signal of the output terminal OUT has substantially the first power voltage VDD. Therefore, the output signal swings between the first power voltage VDD and the voltage level determined by the ratio of the size of the second transistor M2 to the size of the third transistor M3. As a result, the swing width of the output signal may be regulated by varying the sizes of the second and third transistors M2 and M3.

When the clock signal CK1 has an inactive level and the clock signal CK0 has an active level, the output signal of the first NOR gate 952 has an inactive level, the first transistor M1 is turned on, and the second transistor M2 is turned off. In the above case, when the data D1 has an inactive level, since the third transistors M3 is turned off and the fourth transistor M4 is turned on, a current path is formed between the first and fourth transistors M1 and M4. Thus, the output signal of the output terminal OUT has a voltage level determined by a ratio of a size of the first transistor M1 to a size of the fourth transistor M4. When the data D1 has an active level, since the third transistor M3 is turned on, the output signal of the output terminal OUT has substantially the first power voltage VDD. Therefore, the output signal swings between the first power voltage VDD and the voltage level determined by the ratio of the size of the first transistor M1 to the size of the fourth transistor M4. As a result, the swing width of the first output signal may be regulated by varying the sizes of the first and fourth transistors M1 and M4.

In an exemplary embodiment, the ratio of the size of the second transistor M2 to the size of the third transistor M3 is about 1:1. In an exemplary embodiment, the ratio of the size of the first transistor M1 to the size of the fourth transistor M4 is about 1:1.

A 2:1 serializer having a NOR gate implementation, such as 2:1 serializer 950 including the NOR gates 952 and 954 may be applied to a single type 2:1 serializer. In addition, a 2:1 serializer having a NOR gate implementation, such as 2:1 serializer 950 including the NOR gates 952 and 954 may also be applied to a differential type 2:1 serializer. In particular, the 2:1 serializer 950 may be used as the first and second serializers of the differential type 2:1 serializer of FIG. 8. In the second serializer using the 2:1 serializer 950, the data D1B and clock signal CK1 are input to the input terminals of the first NOR gate 952, and the data D0B and clock signal CK0 are input to the input terminals of the second NOR gate 954. The second serializer using the 2:1 serializer 950 is coupled to the first serializer using the 2:1 serializer 950 in parallel, and the first and second serializers are coupled to the output driver circuit, so that the 2:1 serializer 950 may be applied to the differential type 2:1 serializer.

Figure 11:
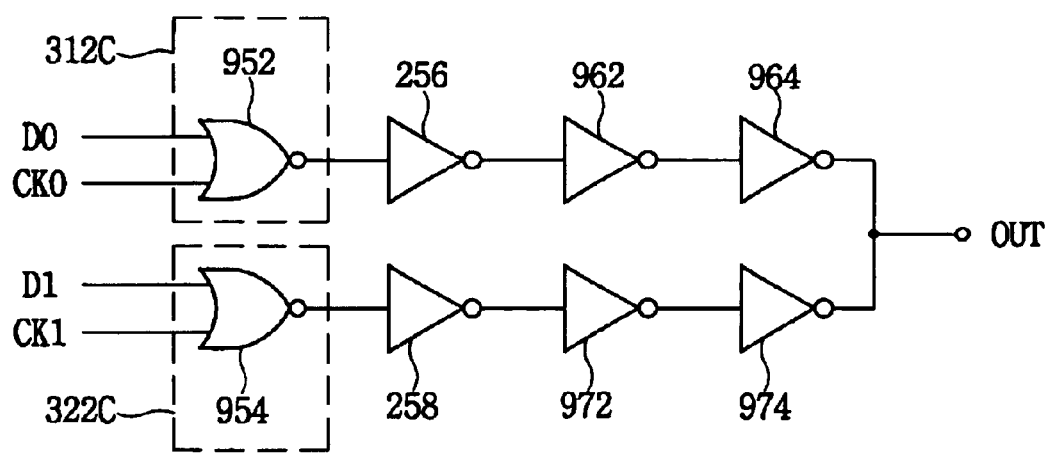
FIG. 11 is an equivalent logic circuit diagram showing a 2:1 serializer according to another exemplary embodiment of the present invention.

FIG. 11 is an equivalent logic circuit diagram showing a 2:1 serializer according to yet another exemplary embodiment of the present invention.

Referring to FIG. 11, the 2:1 serializer 1150 includes a first logic section 312c and a first inverter 256, a third inverter 962, a fourth inverter 964, a second logic section 322c, a second inverter 258, a fifth inverter 972 and a sixth inverter 974.

The third inverter 962 and the fourth inverter 964 are serially connected to the first inverter 256. The fifth inverter 972 and the sixth inverter 974 are serially connected to the second inverter 258. The third, fourth, fifth and sixth inverter 962, 964, 972 an 974 functions as buffers, and the logical operation of the 2:1 serializer 1150 is the same as that of the 2:1 serializer 950.

As discussed above, a 2:1 serializer having a gate implementation, such as 2:1 serializer 1150 may be applied to a single type 2:1 serializer. In addition, a 2:1 serializer having a 2:1 serializer having a gate implementation, such as 2:1 serializer 1150 may also be applied to a differential type 2:1 serializer.

Figure 12:
FIG. 12 is a schematic diagram showing a N:1 serializer according to another exemplary embodiment of the present invention.

In exemplary embodiments, any of the 2:1 serializers 250, 950, 1150 may be applied to an N:1 serializer, where N is a natural number greater than 2. FIG. 12 is a schematic diagram showing a N:1 serializer, and FIG. 13 is an equivalent logic circuit diagram showing a N:1 serializer according to another exemplary embodiment of the present invention.

Referring to FIG. 12, the N:1 serializer 1200 receives N bits of parallel data and serializes the N bits of parallel data to output the serialized data via an output terminal OUT.

Figure 13:
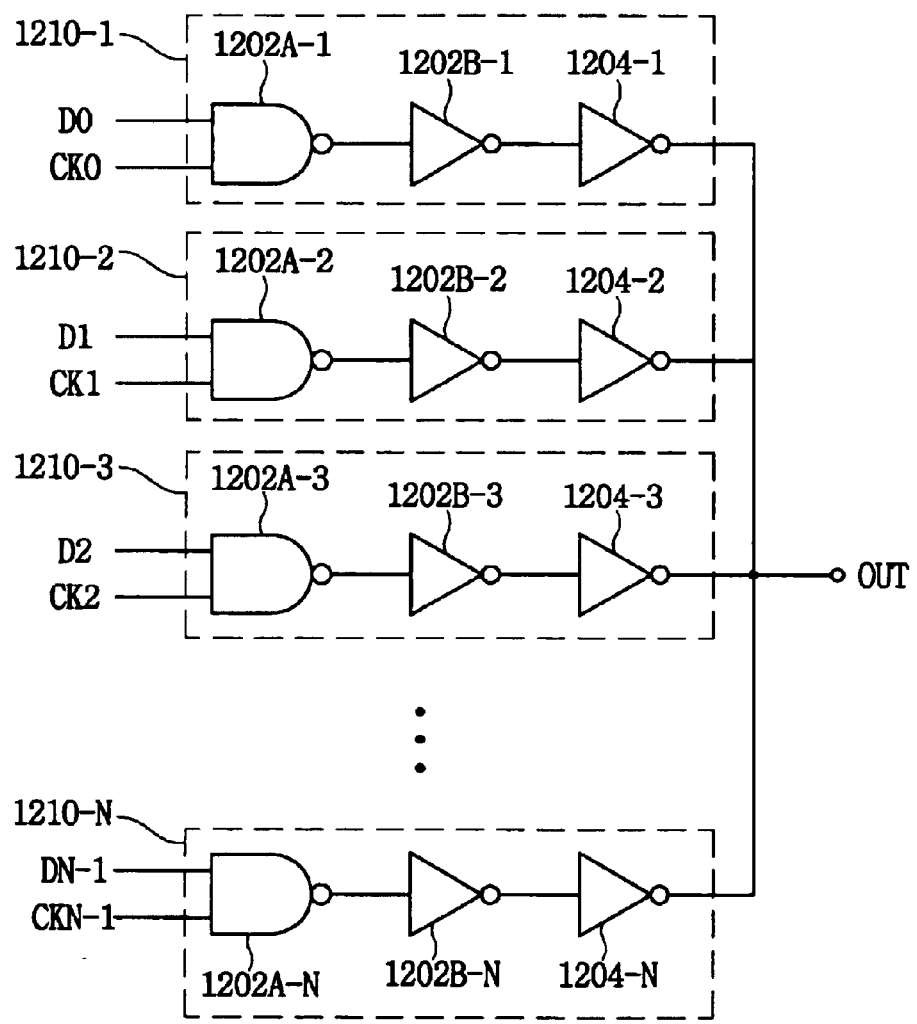
FIG. 13 is an equivalent logic circuit diagram showing a N:1 serializer according to another exemplary embodiment of the present invention.

Referring to FIG. 13, the N:1 serializer 1200 includes N stages 1210-1, 1210-2, 1210-3, ..., 1210-n. Each of the stages 1210-1, 1210-2, 1210-3, ..., 1210-n may include a NAND gate, a first inverter and a second inverter.

A first NAND gate 1202a-1 of a first stage 1210-1 receives the data D0 and a clock signal CK0, and performs a logical NAND operation on the data D0 and the clock signal CK0. A first inverter 1202b-1 of the first stage 1210-1 inverts the output signal of the first NAND gate 1202a-1, a second inverter 1204-1 of the first stage 1210-1 inverts the output signal of the first inverter 1202b-1 to output the inverted output signal via an output terminal OUT.

A second NAND gate 1202a-2 of a second stage 1210-2 receives the data D1 and a clock signal CK1, and performs a logical NAND operation on the data D1 and the clock signal CK1. A first inverter 1202b-2 of the second stage 1210-2 inverts the output signal of the second NAND gate 1202a-2, a second inverter 1204-2 of the second stage 1210-2 inverts the output signal of the first inverter 1202b-2 to output the inverted output signal via the output terminal OUT.

Third, fourth, ..., Nth NAND gates 1202a-3, 1202a-4, ..., and 1202a-n respectively receive a data D2 and a clock signal CK2, a data D3 and a clock signal CK3, ..., a data Dn−1 and a clock signal CKn−1, and perform a logical NAND operation on the data D1 and the clock signal CK1, the data D3 and the clock signal CK3, ..., and the data Dn−1 and the clock signal CKn−1, respectively.

First inverters 1202b-3, 1202b-4, ..., 1202b-n invert the output signals of the NAND gates 1202a-3, 1202a-4, ..., and 1202a-n, respectively. Second inverters 1204-3, 1204-4, ..., 1204-n invert the output signals of the first inverters 1202b-3, 1202b-4, ..., 1202b-n, respectively to output the inverted output signals via the output terminal OUT.

Figure 14:
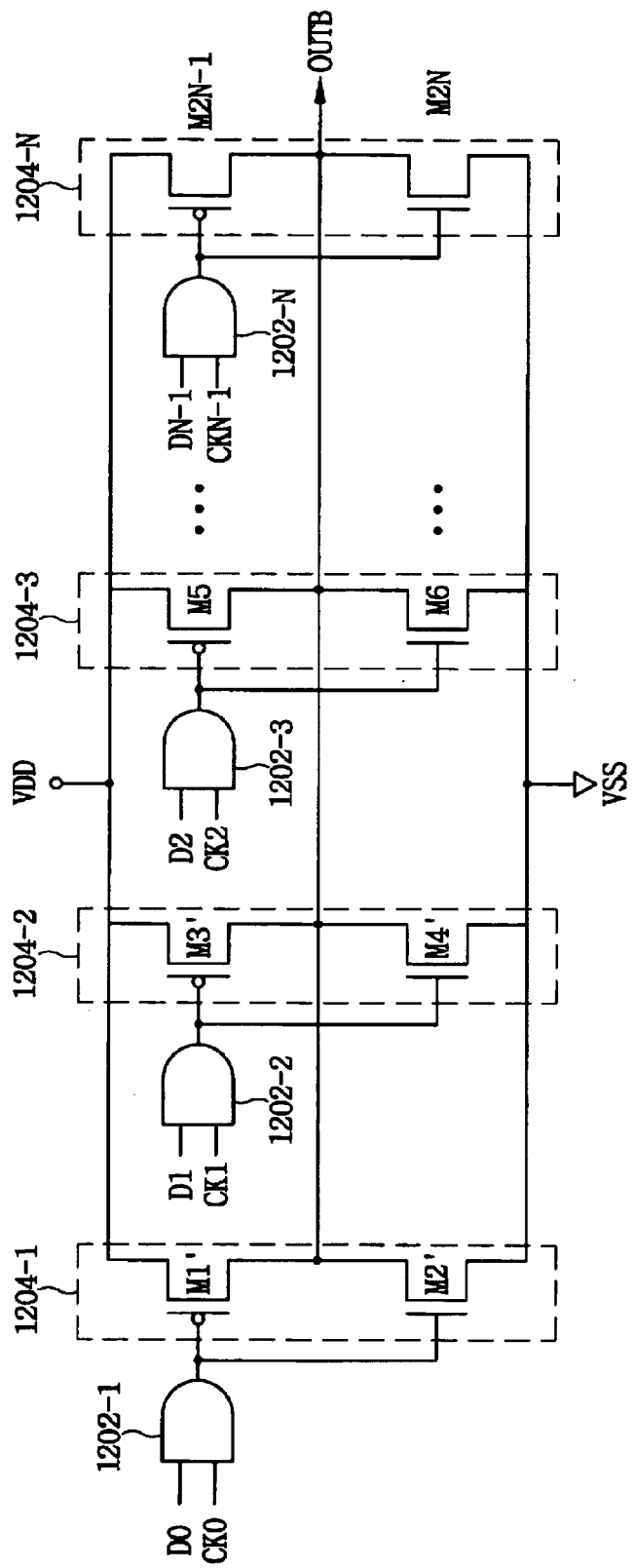
FIG. 14 is a circuit diagram showing the N:1 serializer of FIG. 13 according to an exemplary embodiment of the present invention.
Figure 15:
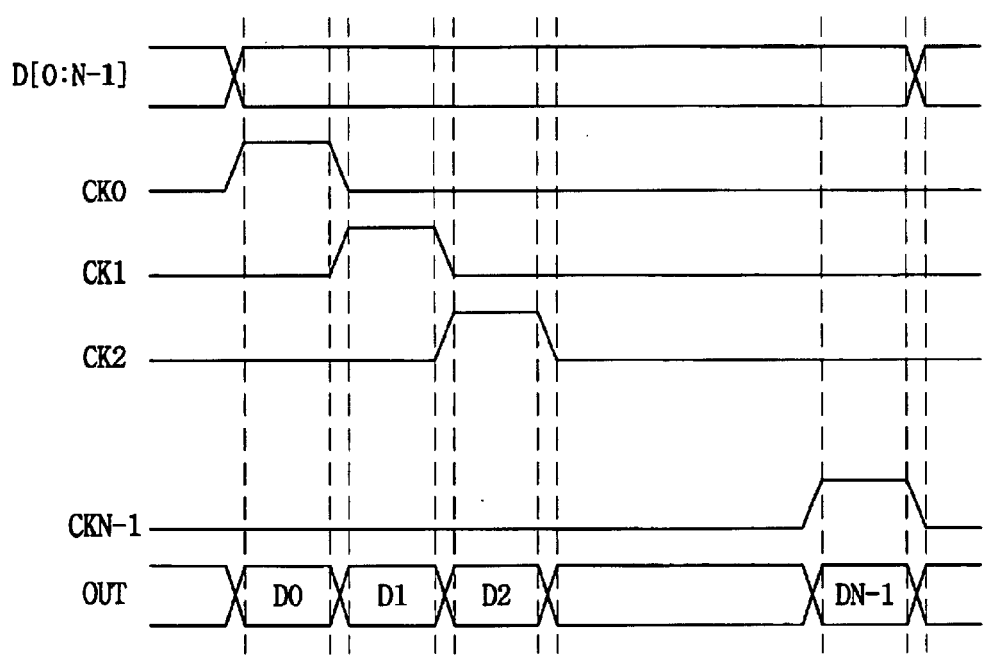
FIG. 15 is a timing diagram showing N parallel input data and serialized output data stream of the N:1 serializer of FIG. 14 according to an exemplary embodiment of the present invention.

FIG. 14 is an exemplary circuit diagram showing the N:1 serializer of FIG. 13, and FIG. 15 is a timing diagram showing N parallel input data and serialized output data stream of the N:1 serializer of FIG. 14.

Referring to FIGS. 14 and 15, the N:1 serializer 1200 receives N parallel data D0, D1, ..., Dn−1 and clock signals CK0, CK1, ..., CKn each having different phases, and serializes the N parallel data D0, D1, ..., Dn−1 in response to the active status or the inactive status of clock signals CK0, CK1, ..., CKn into a serialized data stream to output the serialized data stream via the output terminal OUTB.

The first AND gate 1202-1 corresponds to the first NAND gate 1202a-1 and the inverter 1202b-1 of FIG. 13. The first AND gate 1202-1 receives the data D0 and clock signal CK0, and the output of the first AND gate 1202-1 is commonly coupled to a gate electrode of a first transistor M1' and a gate electrode of a second transistor M2' of the inverter 1204-1. In an exemplary embodiment, the first transistor M1' is a PMOS transistor, and the second transistor M2' is an NMOS transistor. The inverter 1204-1 may include the first and second transistors M1' and M2'.

The second AND gate 1202-2 corresponds to the second NAND gate 1202a-2 and the inverter 1202b-2 of FIG. 13. The second AND gate 1202-2 receives the data D1 and clock signal CK1, and the output of the second AND gate 1202-2 is commonly coupled to a gate electrode of a third transistor M3' and a gate electrode of a fourth transistor M4' of the inverter 1204-2. In an exemplary embodiment, the third transistor M3' is a PMOS transistor, and the fourth transistor M4' is an NMOS transistor. The inverter 1204-2 may include the third and fourth transistors M3' and M4'.

The Nth AND gate 1202-n corresponds to the Nth NAND gate 1202a-n and the inverter 1202b-n of FIG. 13. The Nth AND gate 1202-n receives data Dn−1 and clock signal CKn−1, and the output of the Nth AND gate 1202-n is commonly coupled to a gate electrode of a (2n−1)th transistor M2n−1 and a gate electrode of a (2n)th transistor M2n of the inverter 1204-n. In an exemplary embodiment, the (2n−1)th transistor M2n−1 is a PMOS transistor, and the (2n)th transistor M2n is an NMOS transistor. The inverter 1204-n may include the (2n−1)th and (2n)th transistors M2n−1 and M2n.

Hereinafter, the operation of the serializer 1200 of FIG. 14 is described with reference to FIGS. 14 and 15. When the clock signal CK0 has an active level and the clock signals CK1, CK2, ..., CKn−1 have inactive levels, the first AND gate 1202-1 outputs D0, the output signals of the second, third, ..., Nth AND gates 1202-2, 1202-3, ..., 1202-n have inactive levels. Thus, the transistors M3', M5, ..., M2n−1 are turned on, and the transistors M4', M6, ..., M2n are turned off. In the above case, when the data D0 has an active level, since the transistor M1' is turned off and the transistor M2' is turned on, a current path is formed between the transistor M2' and the transistors M3', M5, ..., and M2n−1. Thus, the output signal of the output terminal OUTB has a voltage level determined by a ratio of a size of the transistor M2' to a total size of the transistors M3', M5, ..., and M2n−1. When the data D0 has an inactive level, the output signal of the output terminal OUTB has substantially the first power voltage VDD. Therefore, the output signal swings between the first power voltage VDD and the voltage level determined by the ratio of the size of the transistor M2' to the total size of the transistors M3', M5, ..., and M2n−1. As a result, the swing width of the output signal may be regulated by varying the sizes of the transistors M2', M3', M5, ..., and M2n−1.

When the clock signal CK1 has an active level and the clock signals CK0, CK2, CK3, ..., CKn−1 have inactive levels, the second AND gate 1202-2 outputs D1, the first, third, fourth, ..., Nth AND gates 1202-1, 1202-3, 1202-4, ..., 1202-n have inactive levels, the transistors M1', M5, M7, ..., M2n−1 are turned on, and the transistors M2', M6, M8, ..., M2n are turned off. In the above case, when the data D1 has an active level, since the transistor M3' is turned off and the transistors M4' is turned on, a current path is formed between the transistor M4' and the transistors M1', M5, M7, ..., M2n−1. Thus, the output signal of the output terminal OUTB has a voltage level determined by a ratio of a size of the transistor M4' to a total size of the transistors M1', M5, M7, ..., M2n−1. When data D1 has an inactive level, the output signal of the output terminal OUTB has substantially the first power voltage VDD. Therefore, the output signal swings between the first power voltage VDD and the voltage level determined by the ratio of the size of the transistor M4' to the total size of the transistors M1', M5, M7, ..., M2n−1. As a result, the swing width of the output signal may be regulated by varying the sizes of the transistors M4', M1', M5, M7, ..., M2n−1.

As shown in FIG. 15, when an inverter is connected to the output terminal OUTB of the N:1 serializer 1200, a final output signal of an output terminal OUT outputs D0, D1, ..., Dn−1 in response to clock signals CK0, Ck1, ..., CKn−1, respectively.

Figure 16:
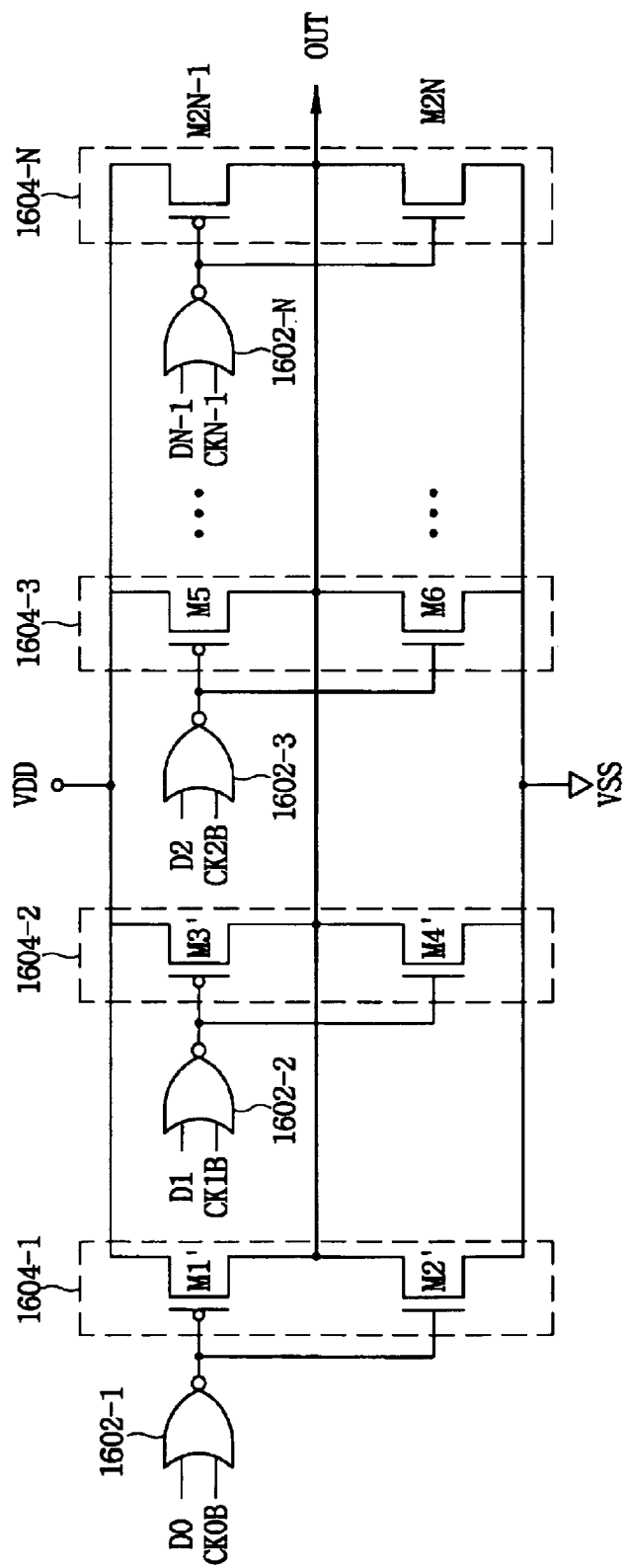
FIG. 16 is an equivalent logic circuit diagram showing a N:1 serializer according to another exemplary embodiment of the present invention.

FIG. 16 is an equivalent logic circuit diagram showing a N:1 serializer according to yet another exemplary embodiment of the present invention. Referring to FIG. 16, the N:1 serializer 1200 receives N parallel data D0, D1, ..., Dn−1 and clock signals CK0B, CK1B, ..., CKnB each having different phases, and serializes the N parallel data D0, D1, ..., Dn−1 in response to the active status or the inactive status of clock signals CK0B, CK1B, . . . , CKnB into a serialized data stream to output the serialized data stream via the output terminal OUT. The clock signals CK0B, CK1B, . . . , CKnB have inverted phases with respect to clock signals CK0, CK1, . . . , CKn, respectively.

The first NOR gate 1602-1 receives data D0 and clock signal CK0B, and the output of the first NOR gate 1602-1 is commonly coupled to a gate electrode of a first transistor M1' and a gate electrode of a second transistor M2' of the inverter 1604-1.

The second NOR gate 1602-2 receives the data D1 and clock signal CK1B, and the output of the second NOR gate 1602-2 is commonly coupled to a gate electrode of a third transistor M3' and a gate electrode of a fourth transistor M4' of the inverter 1604-2.

The Nth NOR gate 1602-n receives data Dn-1 and clock signal CKn-1B, and the output of the Nth NOR gate 1602-n is commonly coupled to a gate electrode of a transistor M2n-1 and a gate electrode of a transistor M2n of the inverter 1604-n.

Hereinafter, the operation of the serializer 1200 of FIG. 16 is described.

When the clock signal CK0B has an inactive level and the clock signals CK1B, CK2B, . . . , CKn-1B have active levels, the first NOR gate 1602-1 outputs D0B, the output signals of the second, third, . . . , Nth NOR gates 1602-2, 1602-3, . . . , 1602-n have inactive levels. Thus, the transistors M3', M5, . . . , M2n-1 are turned on, and the transistors M4', M6, . . . , M2n are turned off. In the above case, when the data D0 has an active level, since the transistor M1' is turned off and the transistor M2' is turned on, a current path is formed between the transistor M2' and the transistors M3', M5, . . . , and M2n-1. Thus, the output signal of the output terminal OUT has a voltage level determined by a ratio of a size of the transistor M2' to a total size of the transistors M3', M5, . . . , and M2n-1. When the data D0 has an active level, the output signal of the output terminal OUT has substantially the first power voltage VDD. Therefore, the output signal swings between the first power voltage VDD and the voltage level determined by the ratio of the size of the transistor M2' to the total size of the transistors M3', M5, . . . , and M2n-1. As a result, the swing width of the output signal may be regulated by varying the sizes of the transistors M2', M3', M5, . . . , and M2n-1.

When the clock signal CK1B has an inactive level and the clock signals CK0B, CK2B, CK3B, . . . , CKn-1B have active levels, the second NOR gate 1602-2 outputs D1B, the first, third, fourth, . . . , Nth NOR gates 1602-1, 1602-3, 1602-4, . . . , 1602-n have inactive levels. Thus, the transistors M1', M5, M7, . . . , M2n-1 are turned on, and the transistors M2', M6, M8, . . . , M2n are turned off. In the above case, when the data D1 has an inactive level, since the transistor M3' is turned off and the transistors M4' is turned on, a current path is formed between the transistor M4' and the transistors M1', M5, M7, . . . , M2n-1. Thus, the output signal of the output terminal OUT has a voltage level determined by a ratio of a size of the transistor M4' to a total size of the transistors M1', M5, M7, . . . , M2n-1. When the data D1 has an active level, the output signal of the output terminal OUT has substantially the first power voltage VDD. Therefore, the output signal swings between the first power voltage VDD and the voltage level determined by the ratio of the size of the transistor M4' to the total size of the transistors M1', M5, M7, . . . , M2n-1. As a result, the swing width of the output signal may be regulated by varying the sizes of the transistors M4', M1', M5, M7, . . . , M2n-1.

As shown in FIG. 15, the output signal of the output terminal OUT outputs D0, D1, . . . , Dn-1 in response to clock signals CK0, Ck1, . . . , CKn-1, respectively.

Figure 17:
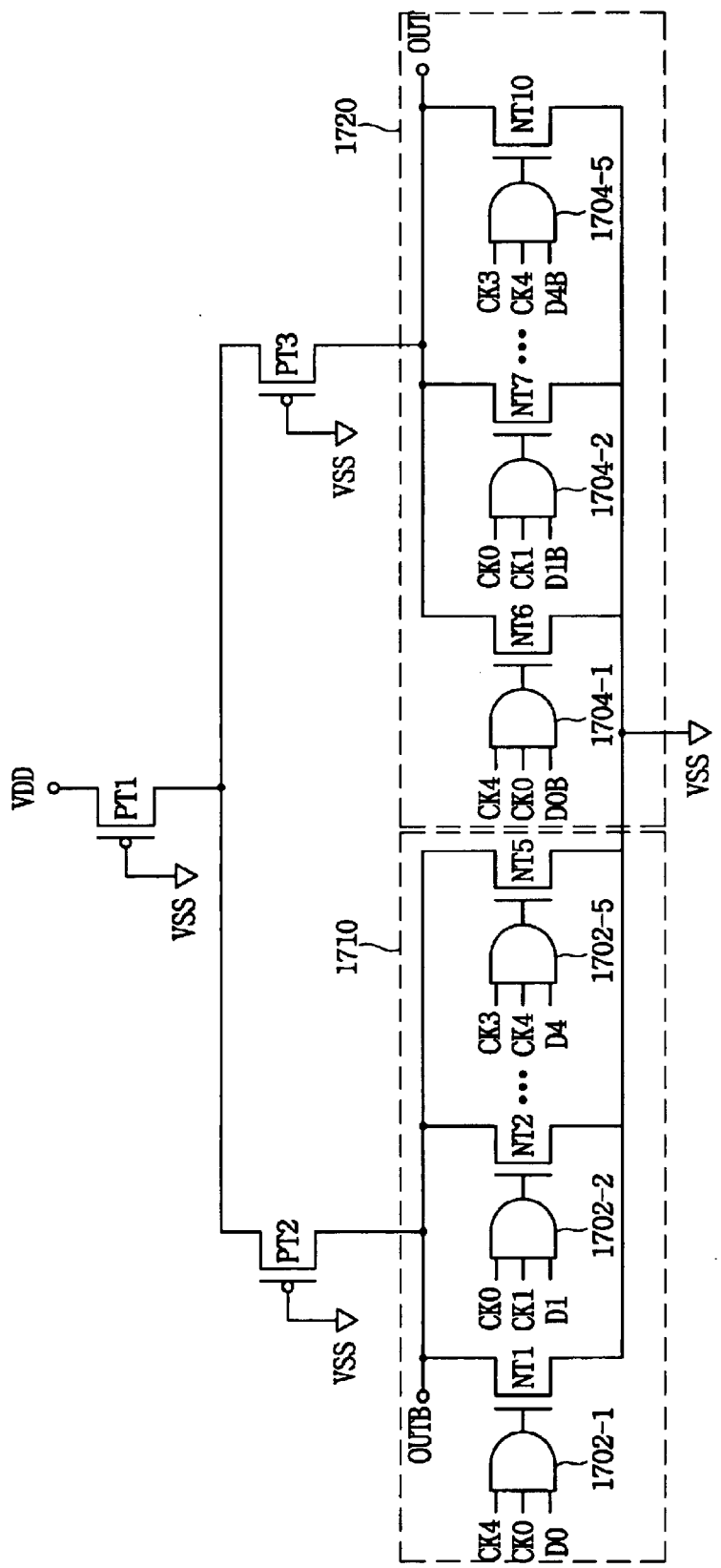
FIG. 17 is a circuit diagram showing a 5:1 serializer as a comparative example according to an exemplary embodiment of the present invention.
Figure 18:
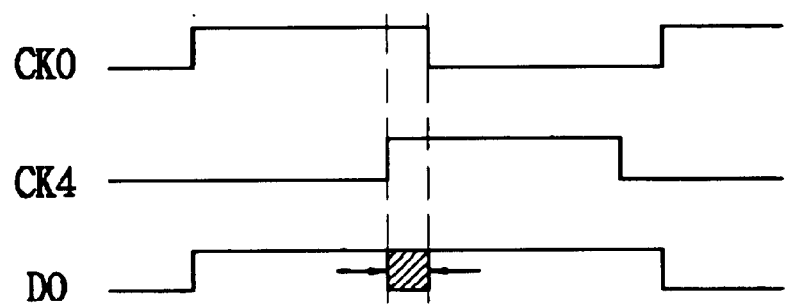
FIG. 18 is a timing diagram showing input data and clock signals of the 5:1 serializer of FIG. 17 according to an exemplary embodiment of the present invention.

FIG. 17 is a circuit diagram showing a 5:1 serializer as a comparative example, and FIG. 18 is a timing diagram showing input data and clock signals of the 5:1 serializer of FIG. 17.

Referring to FIG. 17, the 5:1 serializer includes PMOS transistors PT1, PT2 and PT3, a first serializer 1710 and a second serializer 1720. The gate electrodes of the PMOS transistors PT1, PT2 and PT3 receive a second power voltage VSS to be turned on constantly. The first serializer 1710 and the second serializer 1720 each include 5 stages, and each of the stages includes 3 input AND gate and a NMOS transistor.

Figure 1:
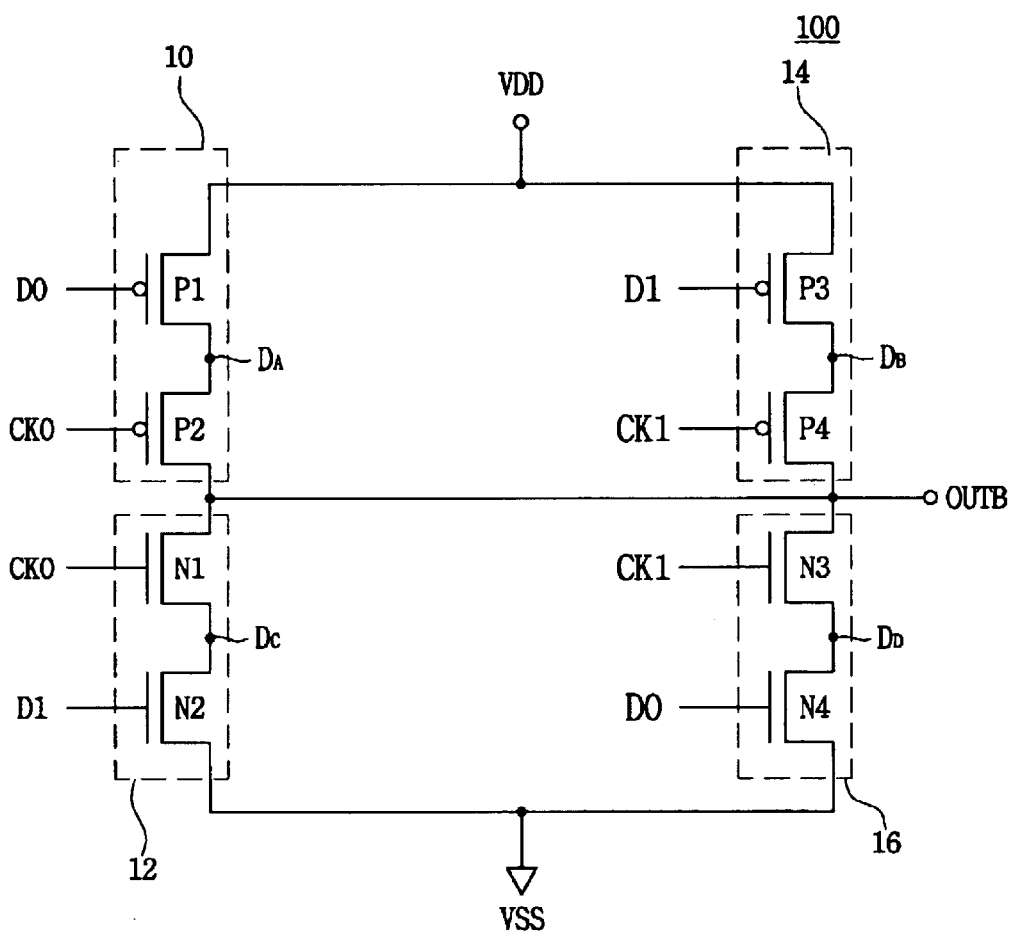
FIG. 1 is a circuit diagram showing a conventional 2:1 serializer.

For each stage of the 5:1 serializer, the serializer of FIG. 1 having 3 NMOS transistors may be modified so that each stage of the 5:1 serializer includes a 3-input AND gate and an NMOS transistor in order to remove floating nodes from the serializer of FIG. 1.

A 3-input AND gate 1702-1 of the first serializer 1710 receives data D0 and clock signals CK4 and CK0, and the output of the 3-input AND gate 1702-1 is connected to a gate electrode of the transistor NT1. When clock signals CK4, CK0 and data D0 have active levels simultaneously, as shown in FIG. 18, an output signal of an output terminal OUTB has a low voltage level. The additional 3-input AND gates 1702-2, 1702-3, 1702-4 and 1702-5 of the first serializer 1710 operate in the same manner as the input AND gate 1702-1.

A 3-input AND gate 1704-1 of the second serializer 1720 receives data D0B and clock signals CK4 and CK0, and the output of the 3-input AND gate 1704-1 is connected to a gate electrode of the transistor NT6. When clock signals CK4, CK0 and data D0B have active levels simultaneously, an output signal of an output terminal OUT has a low voltage level. The additional 3-input AND gates 1704-2, 1704-3, 1704-4 and 1704-5 of the second serializer 1720 operate in the same manner as the input AND gate 1704-1.

Figure 19:
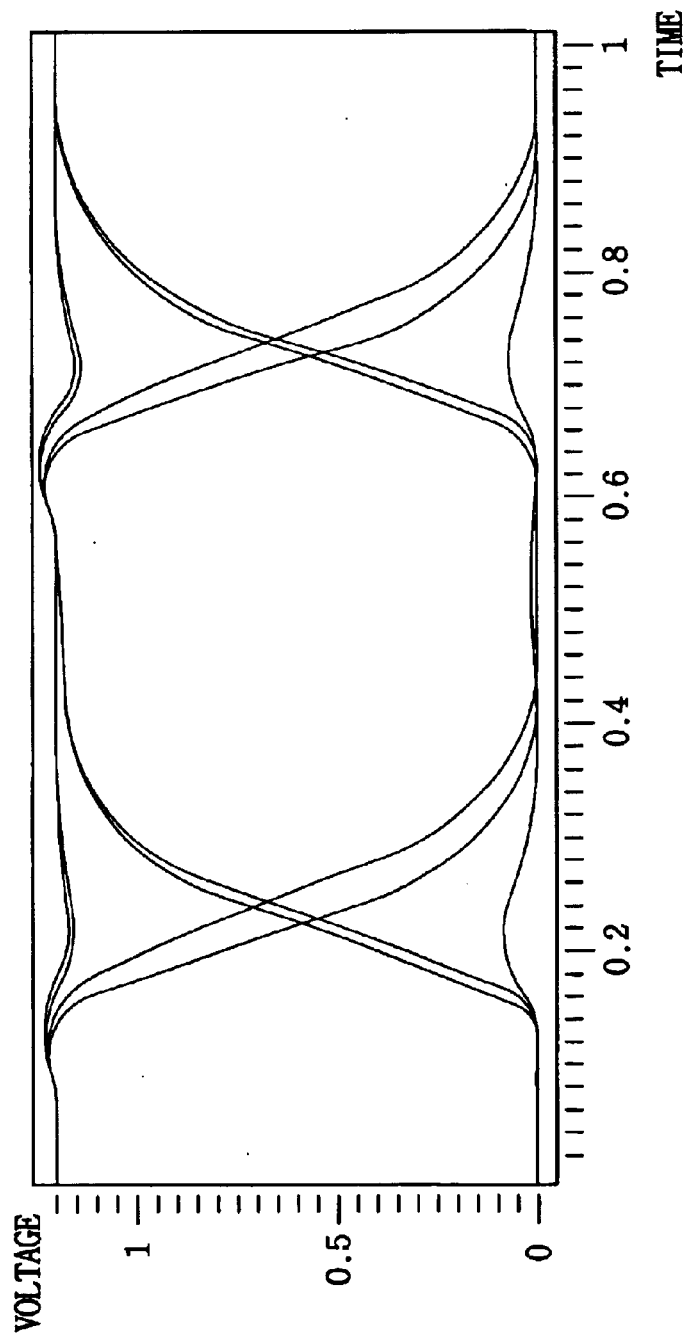
FIG. 19 is a graph showing an eye pattern of the output signal of the serializer of FIG. 1 according to an exemplary embodiment of the present invention.

FIG. 19 is a graph showing an eye pattern of the output signal of the serializer of FIG. 1. Referring to FIG. 19, the output signal of the serializer 100 of FIG. 1 has more than two lines of jitter. In particular, the nodes Da, Db, Dc and Dd acts as floating nodes because of the coupling effect due to parasitic capacitances. In addition, the ISI between the input signals CK0, CK1, D0 and D1 and the output signal of the serializer 100 induces jitter when the serializer 100 operates in a high speed and low power condition.

Figure 20:
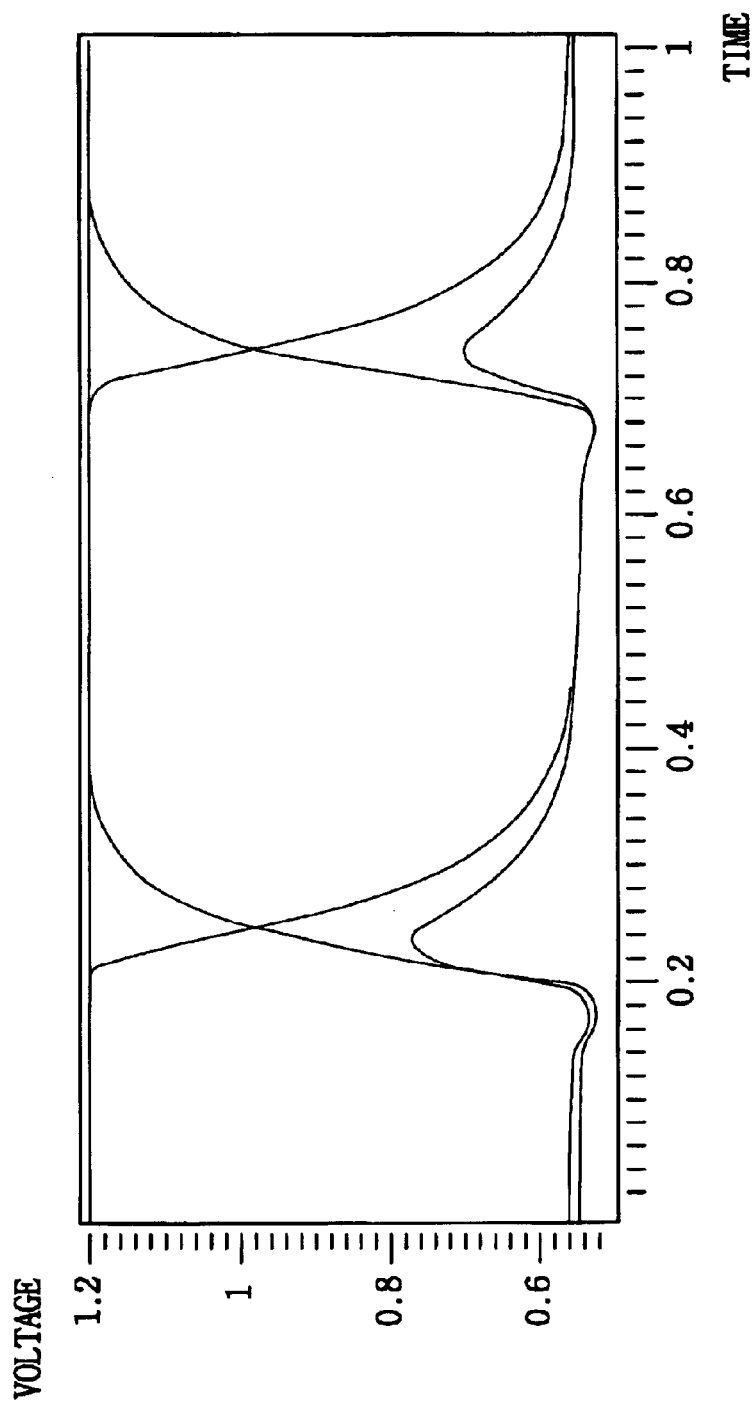
FIG. 20 is a graph showing an eye pattern of the output signal of the serializer of FIG. 17 according to an exemplary embodiment of the present invention.

FIG. 20 is a graph showing an eye pattern of the output signal of the serializer of FIG. 17. Referring to FIG. 20, the eye pattern of the output signal of the serializer of FIG. 17 has no or reduced jitter.

Figure 21:
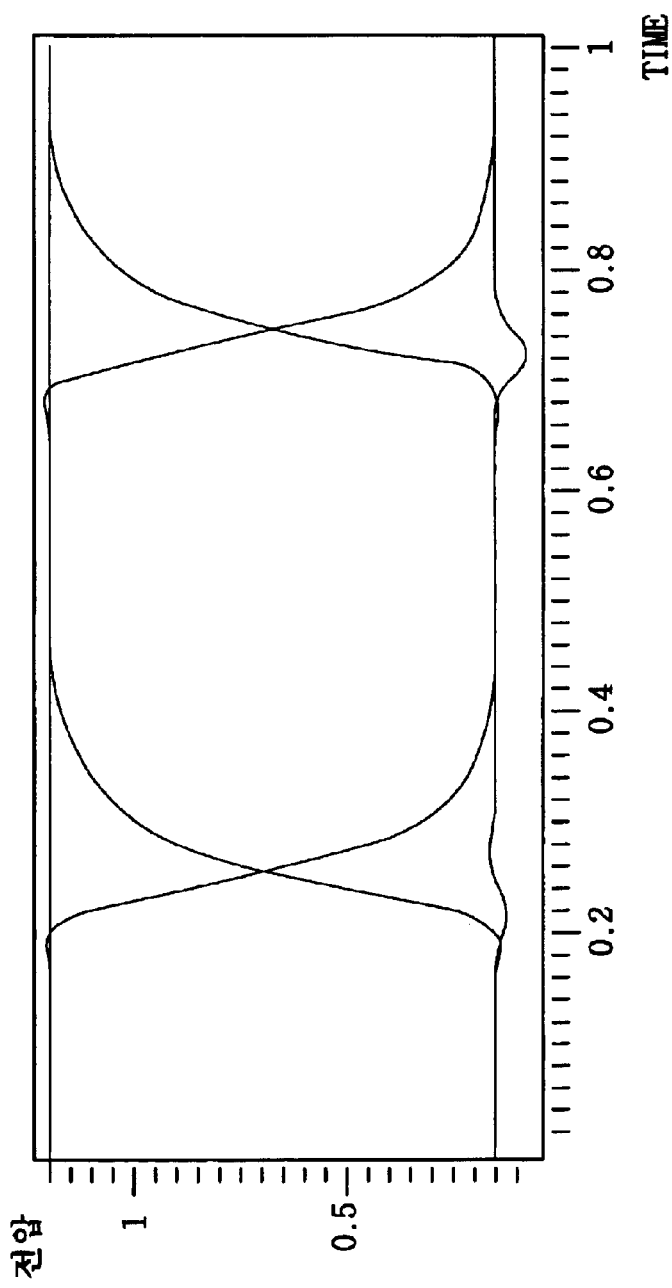
FIG. 21 is a graph showing an eye pattern of the output signal of the serializer of FIG. 5 according to an exemplary embodiment of the present invention.

FIG. 21 is a graph showing an eye pattern of the output signal of the serializer of FIG. 5. Referring to FIG. 21, the serializer of FIG. 5 reduces or prevents the coupling effect, and the ISI between input signals D0, D1, CK0 and Ck1 and output signal is reduced or prevented, thus jitter is not induced and ripple is not generated. In addition, the ripple may be prevented by regulating the sizes of the transistors M2 and M3 (or M1 and M4) of the inverters 256 and 258.

While the exemplary embodiments of the present invention and its advantages have been described in detail, it should be understood that various changes, substitutions and alterations can be made herein without departing from the scope of the invention as defined by appended claims.

What is claimed is:

1. A serializer for transforming N (where N is a natural number greater than 2) parallel data into a serial data stream using N clock signals each having different phase to output the serial data stream, the serializer having N stages, each of the stages coupled in parallel, each of the stages comprising:

a logic section for receiving i-th data of the N parallel data and outputting the i-th data (where i is a natural number less than or equal to N) or inverted i-th data in response to an active status or an inactive status of a j-th clock signal (where j is a natural number less than or equal to N) of the N clock signals; and a first inverter for receiving the i-th data or the inverted i-th data from the logic section, and for inverting the i-th data or the inverted i-th data to output a first output signal.

2. The serializer of claim 1, wherein the logic section includes an AND gate for receiving the i-th data and the j-th clock signal to perform a logical AND operation.

3. The serializer of claim 2, wherein the AND gate includes:

a NAND gate for receiving the i-th data and the j-th clock signal to perform a logical NAND operation; and a second inverter for inverting an output of the NAND gate to output a second output signal.

4. The serializer of claim 2, further comprising a second inverter, coupled to an output terminal of each of the stages, for inverting the first output signal.

5. The serializer of claim 1, wherein the logic section includes a NOR gate for receiving the i-th data and the j-th clock signal to perform a logical NOR operation.

6. The serializer of claim 5, further comprising:

a second inverter for inverting the first output signal to output a second output signal; and a third inverter for inverting the second output signal to output a third output signal.

7. The serializer of claim 1, wherein N is 2.

8. The serializer of claim 7, wherein the first inverter includes:

a first PMOS transistor, a control electrode of the first PMOS transistor receiving an output signal of the logic section of a first stage, and a first current electrode of the first PMOS transistor receiving a first power voltage;

a first NMOS transistor, a first current electrode of the first NMOS transistor receiving a second power voltage, a second current electrode of the first NMOS transistor being coupled to a second current electrode of the first PMOS transistor, and a control electrode of the first NMOS transistor being coupled to the control electrode of the first PMOS transistor, and;

a second PMOS transistor, a control electrode of the second PMOS transistor receiving an output signal of the logic section of a second stage, and a first current electrode of the second PMOS transistor receiving the first power voltage; and a second NMOS transistor, a first current electrode of the second NMOS transistor receiving the second power voltage, a second current electrode of the second NMOS transistor being coupled to a second current electrode of the second PMOS transistor, and a control electrode of the second NMOS transistor being coupled to the control electrode of the second PMOS transistor.

9. The serializer of claim 8, wherein the first output signal swings between substantially a first level of the first power voltage and a second level, the second level is determined by a ratio of a size of the second PMOS transistor to a size of the first NMOS transistor so that the first output signals are prevented from swinging between the first level of the first power voltage and a third level of the second power voltage.

10. The serializer of claim 8, wherein the ratio of the size of the second PMOS transistor to the size of the first NMOS transistor is about 1:1.

11. A serializer for transforming first and second data into a serial data stream using first and second clock signals each having different phase to output the serial data stream, the serializer comprising:

a first logic section for receiving the first data to output the first data or an inverted first data in response to an active status or an inactive status of the first clock signal;

a first inverter for inverting the first data or the inverted first data to output a first output signal;

a second logic section for receiving the second data to output the second data or an inverted second data in response to an active status or an inactive status of the second clock signal; and a second inverter for inverting the second data or the inverted second data to output a second output signal.

12. The serializer of claim 11, wherein the first logic section includes a first AND gate for receiving the first data and the first clock signal to perform a logical AND operation, and the second logic section includes a second AND gate for receiving the second data and the second clock signal to perform the logical AND operation.

13. The serializer of claim 12, wherein the first AND gate includes a first NAND gate for receiving the first data and the first clock signal to perform a logical NAND operation and a third inverter for inverting an output signal of the first NAND gate, and the second logic AND gate includes a second NAND gate for receiving the second data and the second clock signal to perform the logical NAND operation and a fourth inverter for inverting an output signal of the second NAND gate.

14. The serializer of claim 12, further comprising a third inverter, coupled to the output terminal, for inverting the first and second output signals.

15. The serializer of claim 11, wherein the first logic section includes a first NOR gate for receiving the first data and the first clock signal to perform a logical NOR operation, and the second logic section includes a second NOR gate for receiving the second data and the second clock signal to perform the logical NOR operation.

16. The serializer of claim 15, further comprising:

a second inverter for inverting the first and second output signals to output a third output signal; and a third inverter for inverting the third output signal to output a fourth output signal.

17. The serializer of claim 11, wherein the first inverter includes:

a first PMOS transistor, a control electrode of the first PMOS transistor receiving an output signal of the first logic section, and a first current electrode of the first PMOS transistor receiving a first power voltage;

a first NMOS transistor, a first current electrode of the first NMOS transistor receiving a second power voltage, a second current electrode of the first NMOS transistor being coupled to a second current electrode of the first PMOS transistor, and a control electrode of the first NMOS transistor being coupled to the control electrode of the first PMOS transistor;

a second PMOS transistor, a control electrode of the second PMOS transistor receiving an output signal of the second logic section, and a first current electrode of the second PMOS transistor receiving the first power voltage; and a second NMOS transistor, a first current electrode of the second NMOS transistor receiving the second power voltage, a second current electrode of the second NMOS transistor being coupled to a second current electrode of the second PMOS transistor, and a control electrode of the second NMOS transistor being coupled to the control electrode of the second PMOS transistor.

18. The serializer of claim 17, wherein the first and second output signals swing between substantially a first level of the first power voltage and a second level, the second level is determined by a ratio of a size of the second PMOS transistor to a size of the first NMOS transistor so that the first and second output signals are prevented from swinging between the first level of the first power voltage and a third level of the second power voltage.

19. The serializer of claim 17, wherein the ratio of the size of the second PMOS transistor to the size of the first NMOS transistor is about 1:1.

20. A method of serializing N parallel data (where N is a natural number greater than 2) into a serial data stream, the method comprising:

receiving i-th data (where i is a natural number less than or equal to N) of the N parallel data and a j-th clock signal (where i is a natural number less than or equal to N) of N clock signals, the i-th data and i-th clock signal having different phases, and performing a logical operation on the i-th data and the j-th clock signal to output the i-th data or an inverted i-th data in response to an active status or an inactive status of the j-th clock signal.

21. The method of claim 20, wherein the logical operation includes one of performing an AND operation on the i-th data and the j-th clock signal to output the i-th data and performing a NOR operation on the i-th data and the j-th clock signal to output the inverted i-th data.

22. A stage of a serializer comprising:

a logic section for receiving a portion of parallel data to perform a logical operation on the portion of data and a corresponding clock signal and outputting the portion of data or an inverted portion of data in response to an active status or an inactive status of the corresponding clock signal of a plurality of clock signals; and an inverter for receiving the portion of data or the inverted portion of data from the logic section and for inverting the portion of data or the inverted portion of data to output a first output signal.

23. A serializer for transforming N (where N is a natural number greater than 2) parallel data into a serial data stream using N clock signals each having different phase to output the serial data stream, the serializer having N stages, each of the stages coupled in parallel, each of the stages comprising:

means for receiving parallel data and a clock signal; and means for generating serial data from the parallel data to produce a serial output signal, such that the first output signal swings substantially between a first power voltage and a second voltage, wherein the second voltage is determined by a ratio of a size of two or more transistors of the means for generating so that the first output signal does not swing between the first power voltage and a second power voltage.

24. The serializer of claim 23, wherein the ratio of the size of the two or more transistors of the means for generating is about 1:1.

25. The serializer of claim 23, wherein the means for generating is a single type serial data generator.

26. The serializer of claim 23, wherein the means for generating is a differential type serial data generator.

27. The serializer of claim 23, wherein the means for generating is a AND/NAND-gate implemented serial data generator.

28. The serializer of claim 23, wherein the means for generating is a OR/NOR-gate implemented serial data generator.

29. The serializer of claim 23, wherein N is 2.

* * * * *